United States Patent
Chopra et al.

(10) Patent No.: US 6,581,200 B2
(45) Date of Patent: Jun. 17, 2003

(54) ABSTRACTING NETLIST TO MANAGE ROUTING INFORMATION

(75) Inventors: Sachin Chopra, Santa Clara, CA (US); Kong-Fai Wo, San Jose, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 102 days.

(21) Appl. No.: 09/932,747

(22) Filed: Aug. 17, 2001

(65) Prior Publication Data

US 2003/0041309 A1 Feb. 27, 2003

(51) Int. Cl.[7] .............................................. G06F 17/50
(52) U.S. Cl. .............................. 716/12; 716/10; 716/11
(58) Field of Search .............................. 716/8–18, 1–3, 716/5

(56) References Cited

U.S. PATENT DOCUMENTS

| | | | | |
|---|---|---|---|---|
| 6,031,981 A | * | 2/2000 | Lee et al. | 716/10 |
| 6,243,849 B1 | * | 6/2001 | Singh et al. | 716/12 |
| 6,260,183 B1 | * | 7/2001 | Raspopovic et al. | 716/12 |

* cited by examiner

Primary Examiner—Matthew Smith
Assistant Examiner—Paul Dinh
(74) Attorney, Agent, or Firm—Hamilton & Terrile, LLP; Stephen A. Terrile

(57) ABSTRACT

A method of designing an integrated circuit, by generating a first netlist for a first router design tool, abstracting the first netlist to mask selected old routes, and generating a second netlist for a second router design tool using new routing information which excludes the masked old routes. In an exemplary use, the first routing tool is an older tool, while the second routing tool is a newer tool that can provide a more compact database and more efficient routing. The first routing tool may use a format (e.g., ASCII) which is different from the format used by the second router design tool (e.g., binary). In such a case, the channel abstraction may involve extracting all channel routes from the first format, and converting the extracted channel routes into the second format. New routes can be established using the second router design tool based on the second netlist, while preserving other old routes. Abstraction can be achieved by removing from the first netlist selected logic cells which are to be interconnected by the new routes.

18 Claims, 3 Drawing Sheets

ABSTRACTING NETLIST TO MANAGE ROUTING INFORMATION

BACKGROUND OF THE INVENTION

1. Field of the Invention

The present invention generally relates to electronic circuits, specifically, the fabrication of integrated circuits such as microprocessors. More particularly, the present invention relates to computer-aided design (CAD) systems which lay out physical interconnections for logic circuits on an integrated circuit substrate using place and route tools.

2. Description of the Related Art

Modern electronic circuits use many different types of logic components or processing units to carry out numerous functions. In the early years of the semiconducting industry, these components were integrated circuits (ICs) with narrowly limited functionalities. Early small-scale integration ICs contained a few logic gates (AND gates, OR gates, NAND gates, NOR gates, XOR gates, etc.) amounting to a few dozen transistors. These gates are combined in Boolean fashion to implement particular logic circuits. Medium-scale integration increased the range of integrated logic available to counters and similar logic functions, and large-scale integration packed even larger logic functions, such as the first microprocessors, into a single chip. The current era of very large-scale integration (VLSI) offers complex processing and control capabilities with well over a million transistors on a single piece of silicon.

While many digital logic ICs became standard components which could be used to construct a variety of different microelectronic systems, there was a clear desire to provide more customized or tailor-made ICs for the electronics industry. As CMOS process technology has improved, and transistors continue to get smaller, it has become easier for engineers to design larger ICs that may be adapted to a customer's specific needs; these types of ICs are referred to as application-specific integrated circuits (ASICs).

Integrated circuits are designed using computer-aided design (CAD) tools. The integrated circuit design process includes constructing the integrated circuit design out of simple circuits (standard cells) that are connected together electrically using wire interconnects. The standard cells and connections between them are stored in databases called "netlists" (i.e., lists of symbolic interconnections).

As part of the design process, the design information within a netlist is "placed and routed" by the CAD tool. The CAD tool utilizes placing and routing processes (also called placers and routers) that are typically software programs executed on the CAD tool. The placer determines the optimum location of each standard cell within the integrated circuit layout on the semiconductor surface. The placement location is optimized to reduce the distance between standard cells that are electrically connected to each other by wire interconnects (e.g., input/output lines). This is done to minimize semiconductor area consumed by the integrated circuit and is also done to minimize the lengths of wire interconnects to reduce net capacitance within the design. The router optimizes the routing of input/output lines between connected standard cells so that areas of the integrated circuit layout do not become overly congested by input/output lines.

FIG. 1 illustrates a basic flow chart for designing an integrated circuit. In the first step, the designer identifies the primary functions needed for the IC to attain the desired behavior. These primary, high level functions are often specified in a CAD system using a well-known hardware description language (HDL) such as Verilog HDL. The designer simulates and verifies the behavior of the IC high-level design, encapsulated in HDL, using a simulator. The designer then creates the detailed logic for the design using a CAD program that synthesizes the logic from the HDL description using a technology or process-specific library 1. Library 1 consists of predefined macrocells and design rules for a specific fabrication process. Library 1 is usually provided by the ASIC vendor, and typically includes macrocells such as logic gates, sequential logic functions, adders, counters, multiplexers, and latches among other standard functions. Alternatively, the designer can specify the detailed logic directly as Boolean equations or as logic schematics using a schematic capture program.

In addition to using predefined macrocells from a process specific library, the designer may also use custom-patterned blocks, which may be manually crafted by a mask designer. Examples of such custom blocks include random-access memory (RAM), read-only memory (ROM), microcontrollers, and analog-to-digital (A/D) converters. Netlists between the macrocells and any custom blocks, as well as power, ground, and primary input/output (I/O) interconnections, are often automatically generated using a logic synthesis program.

The IC design is next verified at the logical level, using the functions and the timing characteristics supplied in the macrocell library, to determine whether the design is functionally correct and meets the desired timing requirements. This testing is typically performed using a logic simulation tool, such as Verilog, and other timing analysis tools. Such tools take into account the estimated capacitive loads of physical (mask) interconnections, macrocell delay times, sequential macrocell set-up and hold times and other factors important to achieving an accurate simulation of the IC function and performance. Since capacitive loading due to the physical interconnections is not known at this stage, estimates of the loading based on fanout and design size, among other factors, are used.

After logic simulation and timing analysis are successfully completed, the design logic macrocells are placed on a master array and the macrocells interconnections are physically routed according to the design netlist. Macrocell placement and routing are typically automated using a placement and route tool as mentioned above. After placement and routing (layout) are complete, accurate interconnect parasitics for all nets are extracted from the physical patterns and the resulting delays per net are back annotated to the timing verification tools. The designer then performs post-layout timing verification. If any timing violations are detected, the netlist is modified to remove such violations and placement and routing are incrementally performed on the modified netlist. If no timing violations are found in the post-layout verification, mask layers are generated for the design using special software.

In the next step, the foundry or an external mask supplier uses the generated pattern data to ultimately create wafer masks for the manufacture of the IC. The foundry then uses the resulting masks to fabricate the ICs. Once fabricated, either the foundry or the customer tests the ICs. If the test results are unsatisfactory, the design is modified, and all or a portion of the above process is repeated.

A short netlist for a simple circuit is shown in Table 1:

TABLE 1

Exemplary Netlist

XOR A B C
XOR C CN1 Y
AND A B CA
AND C CN1 CB
NOR CB CA CN

The netlist defines all of the interconnections between the components of the circuit. Each "signal" which interconnects two or more cells, or which represents an input or output for the entire circuit, is actually a node in the circuit which has been assigned a name. Thus the terms "signal" and "node" are often used interchangeably. In the exemplary netlist shown in Table 1, signals A, B and CN1 are input nodes to the entire circuit, Y and CN are output nodes for the entire circuit, and nodes C, CA and CB are internal nodes.

In order to maintain a competitive edge in the market for microprocessors, it is imperative to reduce the time needed to productize the design, while at the same time increasing the speed and reliability of the microprocessor. Consequently, it becomes necessary for the designers to extract as much as possible from a given family of microprocessors. Advanced design techniques help only to a certain extent in extending the life of a particular family of microprocessors. Most of the design issues are already dealt with in the early stages of the particular product family development. To increase speed as well as reliability, while holding on to a majority of the old design, new and more robust CAD techniques are required. This need could not be more evident than in the case of microprocessors having a transistor count of greater than 20 million.

There are several approaches to retaining an old design while increasing speed and reliability, among them, adding a second level (e.g., a chip cache), moving to smaller transistor width process technology, or taking advantage of advanced tools to route the chip more efficiently. While each of the above approaches could be applied to a particular design, it is still necessary to retain the old design, i.e., the CAD tools that were used in the design process must be continued with in order to avoid extremely lengthy reworking. There is, however, nothing in the prior art which allows a designer to take advantage of new tools on top of old design tools.

It would, therefore, be desirable to devise an improved method of designing integrated circuits which allows the use of top-level routing while holding onto previous routes that had been routed using the old tools. It would be further advantageous if the method could perform transitions from one library format to another at any stage in the design process (including RC extraction, noise analysis, power and timing estimation, etc.), to allow a designer to take corrective steps as soon as possible and reduce the overall design cycle time. The new methodology should have a small turnaround time that would give the designer the option to experiment with different parameters like different routing directions for layers, power grid width, number of vias, etc.

SUMMARY OF THE INVENTION

It is therefore one object of the present invention to provide an improved method of designing integrated circuits.

It is another object of the present invention to provide such a method which uses a computer-aided design (CAD) system having place and route tools which provide interconnections between circuits using netlists.

It is yet another object of the present invention to provide a method of utilizing old netlists to preserve old routes while still taking advantage of new routing tools.

The foregoing objects are achieved in a method of designing an integrated circuit, generally comprising the steps of generating a first netlist for a first router design tool, abstracting the first netlist to mask selected old routes, and generating a second netlist for a second router design tool using new routing information which excludes the masked old routes. The first routing tool may use a format which is different from the format used by the second router design tool. In such a case, the channel abstraction may involve extracting all channel routes from the first format, and converting the extracted channel routes into the second format. New routes can be established using the second router design tool based on the second netlist, while preserving other old routes. Abstraction can be achieved by removing from the first netlist selected logic cells which are to be interconnected by the new routes. Those cells may be manually removed from the router tool session file using a text editor.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

The present invention is directed to a method of designing integrated circuits, such as a microprocessor, using computer-aided design (CAD) systems. As explained in the Background, these CAD systems utilize netlists to lay out the physical interconnections between logic circuits (standard cells) on an integrated circuit substrate (i.e., silicon wafer) using place and route tools. In the prior art, it is not feasible for the designer to retain an old design using a netlist created from an earlier CAD system, and still take advantage of new tools in conjunction with the old design tools. The new methodology taught by the present invention allows a circuit designer to easily retain the previous routes, while enjoying the benefits of top-level design tools.

For example, many routes in an old design are manually added or edited to take care of problems such as timing, noise, cross-coupled capacitance, shorting, etc. These routes may be part of the final design and may need to be preserved in the next design version of the microprocessor. As a further example, there might be a desire to preserve some channel routes between blocks on one side of a channel and a cache on the other side of the channel. The channel routes could consist of block-to-block routes and block-to-cache routes. If only the block-to-block routes are to be retained, and the cache-to-block routes are to be re-routed, this would require a netlist showing the connectivity as is, and a netlist-driven router would be used to route the cache-to-block routes; however, preparing such a netlist from scratch is not be feasible of because of the channel abstraction.

The present invention overcomes this limitation of the prior art by abstracting the old netlist, so that the new router is not be able to see the old routes. Then, the router can be supplied with a new netlist (with the new routing information), and re-route the new routes while holding on to the old needed routes. In one implementation of the present invention, all of the channel routes are extracted from the old environment, and converted into the format of the netlist-driven router (the physical layout tool). The blocks to which routes are not required are then removed from the input (e.g., cache blocks). The area router, on not seeing some blocks, drops the routes to those blocks, e.g., removes the routes to the cache. The resulting new routes are thus as desired, and can be translated back to the old environment format. A netlist extraction tool is used to generate the final required netlist. This final netlist is again fed into the netlist-driven area router to yield the new routes as well as holding on to the older important routes.

Figure 1:
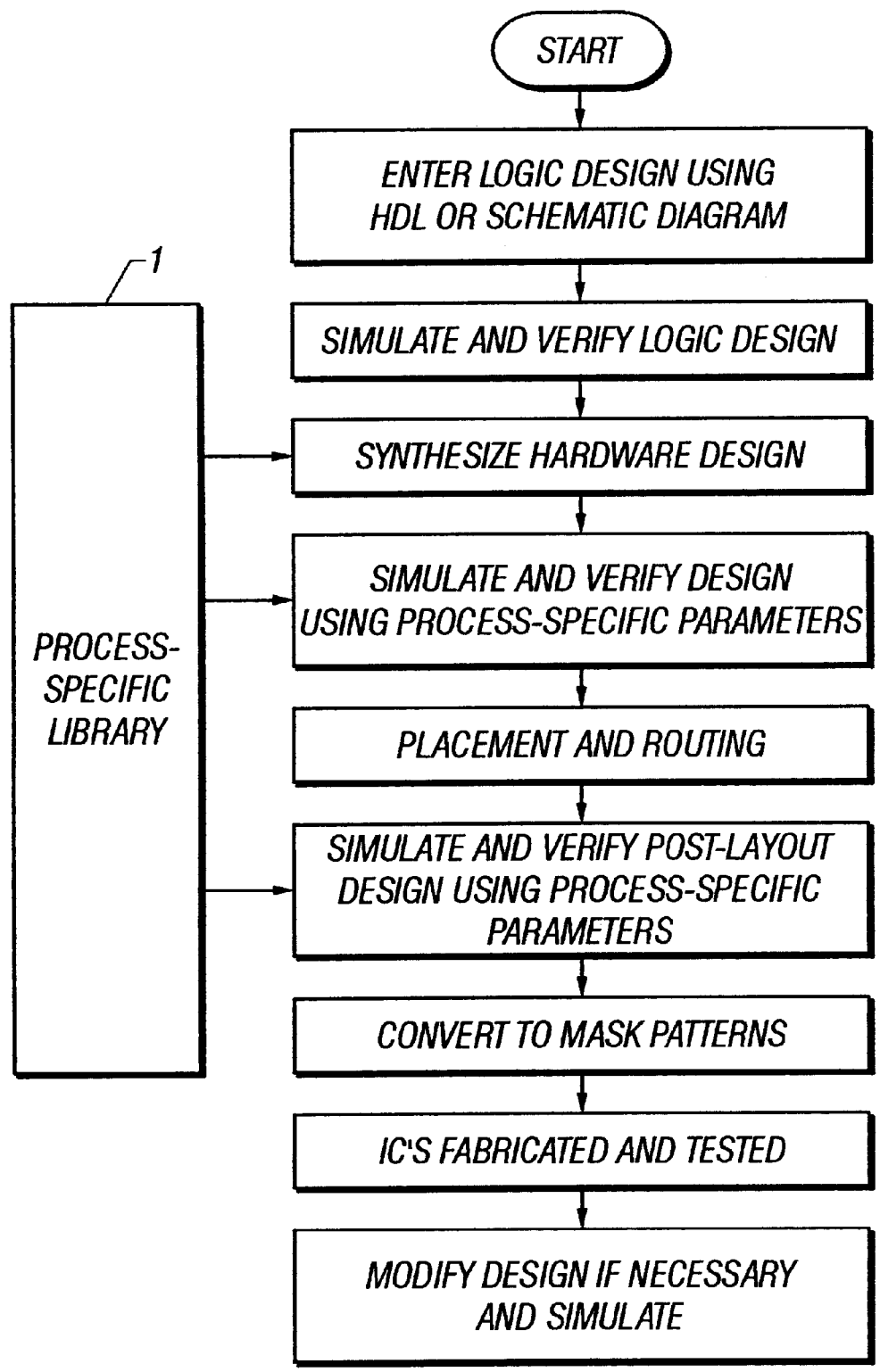
FIG. 1 is a chart showing the logical flow for designing an integrated circuit (IC) according to the prior art, using a computer-aided design (CAD) system having placement and routing tools.
Figure 2:
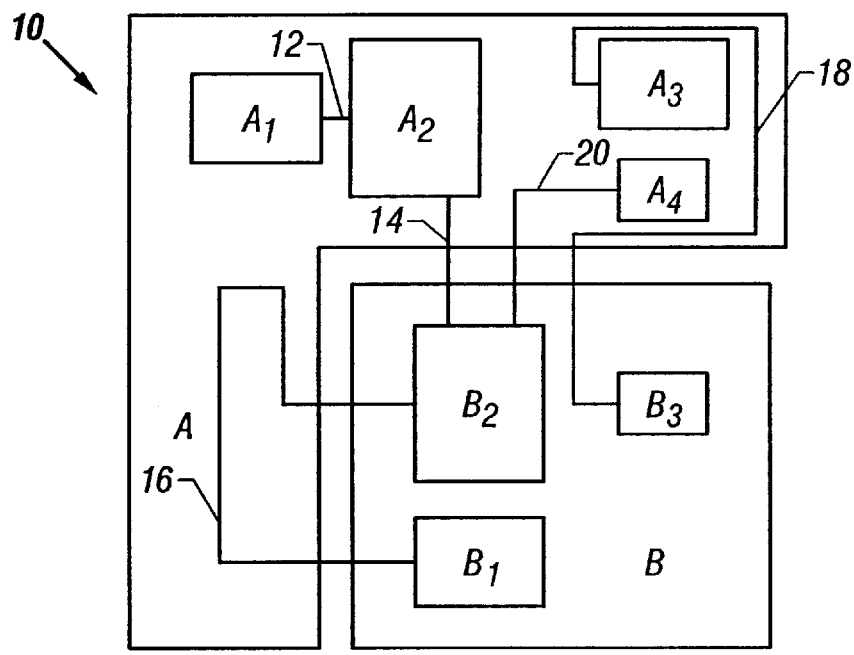
FIG. 2 is a plan view of an integrated circuit layout with cells and routes laid out according to a first place-and-route CAD tool, in accordance with a first design phase of the present invention.
Figure 3:
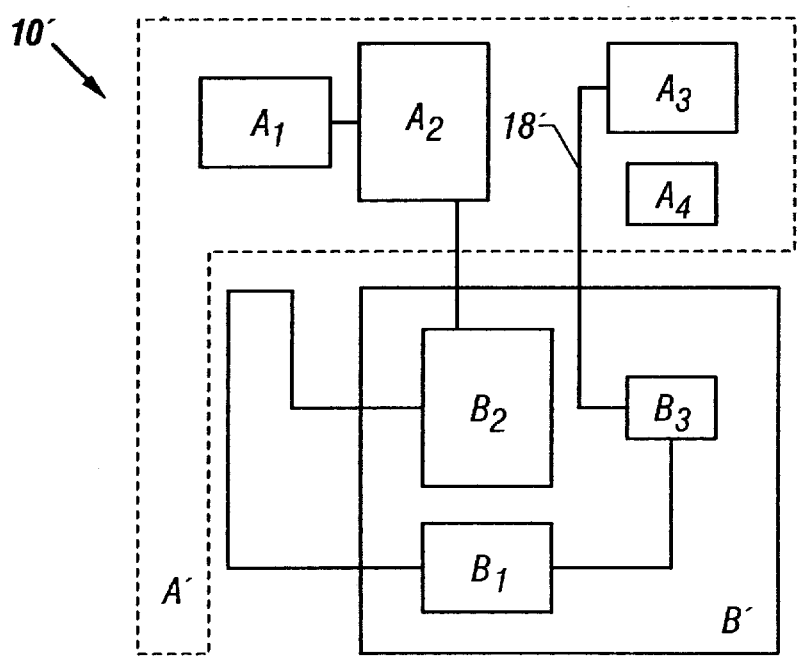
FIG. 3 is a plan view of a modified integrated circuit layout, similar to FIG. 2, with the cells and routes laid out according to a second place-and-route tool while preserving certain old routes, in accordance with a second design phase of the present invention.

With reference now to the figures, and in particular with reference to FIGS. 2 and 3, there are depicted two different exemplary design phases in the construction of an integrated circuit according to the present invention. FIG. 2 illustrates an integrated circuit 10 having two primary functional areas, area A and area B. These different areas may be, e.g., a cache (area A) and a processor core (area B). The cache may include several different cells $A_1$, $A_2$, $A_3$, and $A_4$, and the processor core similarly includes multiple cells $B_1$, $B_2$, and $B_3$. The layout of the cells and the routes is determined using a first (e.g., older) place-and-route CAD tool. It is understood that the layout of an actual circuit is much more complicated than shown in FIG. 2, but the number of cells and routes has been reduced to simplify the discussion. In this example, different routes are provided to connect cell $A_1$ to cell $A_2$ (route 12), cell $A_2$ to cell $B_2$ (route 14), cell $B_1$ to cell $B_2$ (route 16), cell $A_3$ to cell $B_3$ (route 18), and cell $A_4$ to cell $B_2$ (route 20).

FIG. 3 illustrates a modified integrated circuit 10' having a layout similar to that of FIG. 2, with the cells and routes laid out according to a second (e.g., newer) place-and-route tool while preserving certain old routes, in accordance with a second design phase of the present invention. Integrated circuit 10' still has a cache area (A'), and a processing core area (B'). In this example, the newer place-and-route tool has more efficiently selected certain routes, such as route 18' which now interconnects cell $A_3$ with cell $B_3$. The new layout may additionally have some interconnections that were not provided before, such as route 22 between cells $B_1$ and $B_3$. The designer may have determined that it is important, however, to retain the old route 16 between cells $B_1$ and $B_2$. This preservation of the old route is achieved, as explained above, by masking off a portion of the cache area A', as indicated by the dashed lines. Certain other routes, such as route 20, may be eliminated, by temporarily removing an old cell from the netlist (cell $A_4$). The resulting new routes are thus improved, and can be translated back to the original netlist format.

Figure 4:
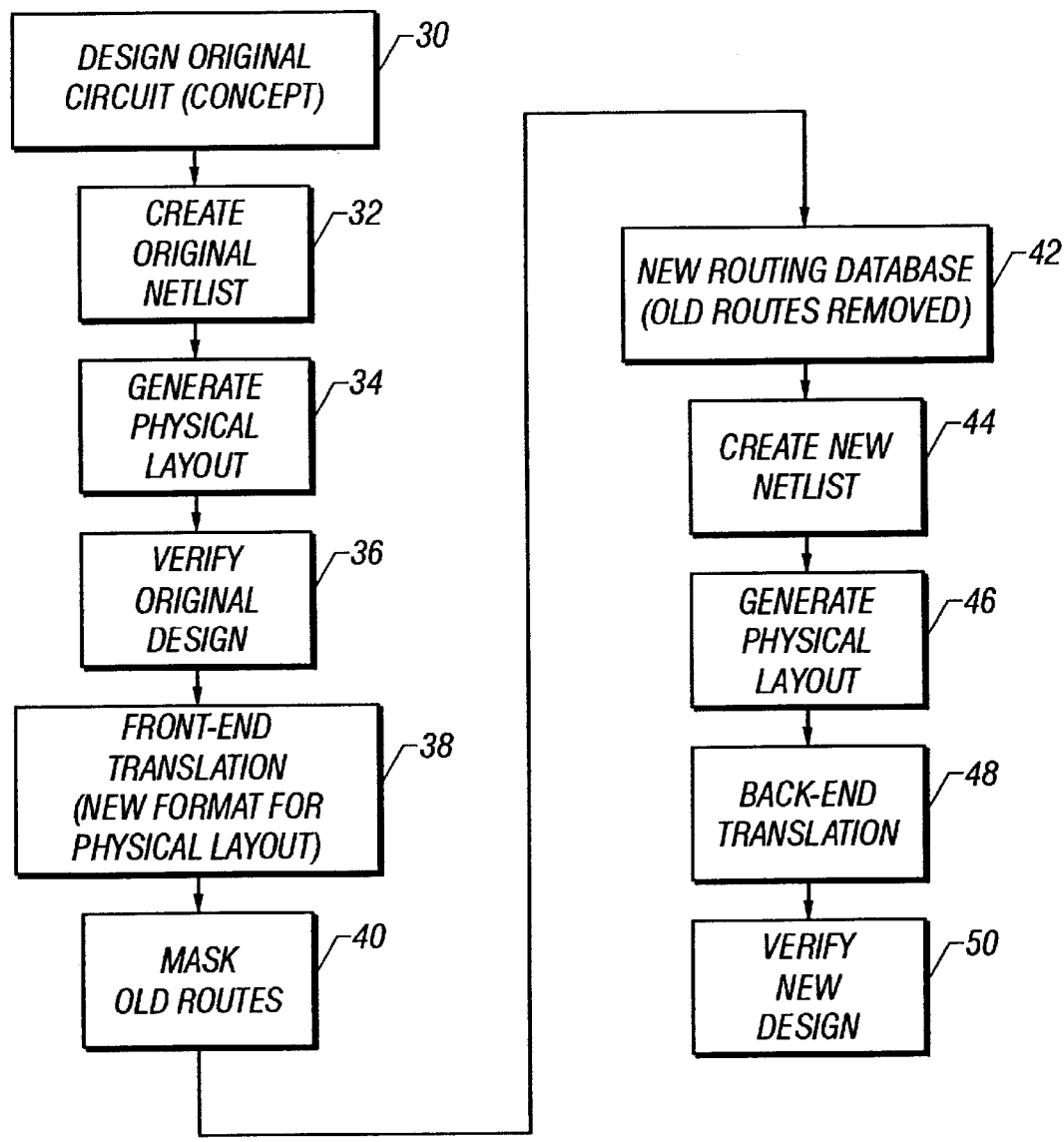
FIG. 4 is a chart illustrating the logical flow according to one implementation of the present invention.

The invention may be further understood with reference to the flow chart of FIG. 4. The IC design process begins with the original circuit concept (30). A netlist is then created for the original design (32), and the physical layout is generated using the first (old) tool (34). The original design is verified prior to abstraction of the channels (36). The old netlist is then translated (if necessary) to the format of the second (new) place-and-route tool (38). For example, the older tool may use an ASCII syntax, while the newer tool may use a binary syntax. After masking any old routes that are not desired (40), a new routing database is provided with the old routes removed (42). The old routes may be effectively masked by removing blocks from the router tool session files (using a text editor). A corresponding new netlist is created (44), and the physical layout generated (46). The layout is then translated (if necessary) back to the old format (48) and, after final verification of the new design (50), the design process is completed.

The removal of old routes (e.g., the cache-block routes) is not possible, other than manually, in the old environment. Such manual involvement would delay a project by several weeks, if not months. By abstracting the old netlist and creating a new one using the above methodology, the designer not only saves time, but further creates a more compact routing database using newer routing tools.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. For example, the method of the present invention may be embodied in a computer program product which includes the appropriate program instructions contained in a computer-readable medium (e.g., a storage medium or transmission medium). The invention may thus be carried out on a general-purpose computer system (having a processor, memory, etc.) which has been appropriately programmed to carry out the various design steps. It is therefore contemplated that such modifications can be made without departing from the spirit or scope of the present invention as defined in the appended claims.

What is claimed is:

1. A method of building a netlist of symbolic interconnections within an electronic circuit, for use with a computer-aided design (CAD) system, the method comprising:

generating a first netlist for a first router design tool;

abstracting the first netlist to mask selected old routes; and generating a second netlist for a second router design tool using new routing information which excludes the masked old routes; and, establishing new routes using the second router design tool based on the second netlist, while preserving other old routes, the abstracting including removing from the first netlist selected logic cells which are to be interconnected by the new routes.

2. The method of claim 1 wherein the first router design tool uses a format which is different from a format used by the second router design tool.

3. The method of claim 2 wherein said abstracting step includes:

extracting channel routes from the first format; and converting the extracted channel routes into the second format.

4. The method of claim 2 further comprising the step of translating the new routes to the first format.

5. The method of claim 1 further comprising the step of generating a final netlist using a netlist extraction tool, based on the first and second netlists.

6. The method of claim 1 wherein said abstracting step further includes the step of removing at least one route to the selected logic cells which were removed.

7. A computer system adapted to design an integrated circuit, comprising:

a memory device; and program instructions stored on said memory device for generating a first netlist for a first router design tool, abstracting the first netlist to mask selected old routes, generating a second netlist for a second router design tool using new routing information which excludes the masked old routes, and establishing new routes using the second router design tool based on the second netlist, while preserving other old routes, the abstracting the first netlist including removing from the first netlist selected logic cells which are to be interconnected by the new routes.

8. The computer system of claim 7 wherein the first router design tool uses a format which is different from a format used by the second router design tool.

9. The computer system of claim 8 wherein said program instructions abstract the first netlist by extracting channel routes from the first format, and converting the extracted channel routes into the second format.

10. The computer system of claim 8 wherein said program instructions further translate the new routes to the first format.

11. The computer system of claim 7 wherein said program instructions further generate a final netlist using a netlist extraction tool, based on the first and second netlists.

12. The computer system of claim 7 wherein said program instructions abstract the first netlist by removing at least one route to the selected logic cells which were removed.

13. A computer program product comprising:

a computer-readable medium; and program instructions on said computer-readable medium, for generating a first netlist for a first router design tool, abstracting the first netlist to mask selected old routes, and generating a second netlist for a second router design tool using new routing information which excludes the masked old routes.

14. The computer program product of claim 13 wherein the first router design tool uses a format which is different from a format used by the second router design tool.

15. The computer program product of claim 14 wherein said program instructions abstract the first netlist by extracting channel routes from the first format, and converting the extracted channel routes into the second format.

16. The computer program product of claim 14 wherein said program instructions further translate the new routes to the first format.

17. The computer program product of claim 13 wherein said program instructions further generate a final netlist using a netlist extraction tool, based on the first and second netlists.

18. The computer program product of claim 13 wherein said program instructions abstract the first netlist by removing at least one route to the selected logic cells which were removed.

* * * * *